United States Patent [19]

Ueda et al.

[11] Patent Number: 4,998,131
[45] Date of Patent: Mar. 5, 1991

[54] METHOD AND APPARATUS FOR RECORDING IMAGE DATA IN MULTIPLEXED MANNER

[75] Inventors: Masashi Ueda; Nakai Hitoshi, both of Nagoya, Japan

[73] Assignee: Brother Kogyo Kabushiki Kaisha, Aichi, Japan

[21] Appl. No.: 175,392

[22] Filed: Mar. 30, 1988

[30] Foreign Application Priority Data

Apr. 3, 1987 [JP] Japan .............................. 62-51513[U]
Sep. 17, 1987 [JP] Japan .............................. 62-233240

[51] Int. Cl.$^5$ ........................ G03B 27/32; G03B 27/52
[52] U.S. Cl. ........................................ 355/27; 355/40; 355/100
[58] Field of Search ..................... 355/27, 28, 71, 40, 355/41, 244, 106, 100; 354/108, 109, 110, 120, 123; 430/138, 211; 350/331 R, 334

[56] References Cited

U.S. PATENT DOCUMENTS

| | | | |
|---|---|---|---|
| 3,916,423 | 10/1975 | Ueda et al. | 354/108 |
| 4,399,209 | 8/1983 | Sanders | 430/138 |
| 4,440,846 | 4/1984 | Sanders et al. | 430/138 |
| 4,472,047 | 9/1984 | Stoudt | 355/77 X |
| 4,587,194 | 5/1986 | Adair et al. | 430/138 |
| 4,672,014 | 6/1987 | Joiner et al. | 430/138 X |
| 4,717,930 | 1/1988 | Wheeler | 354/108 |
| 4,740,809 | 4/1988 | Yamamoto et al. | 355/27 |
| 4,806,446 | 2/1989 | Hatta et al. | 430/138 |
| 4,810,614 | 3/1989 | Sangyoji et al. | 430/138 |
| 4,829,340 | 5/1989 | Yamamoto et al. | 355/38 X |

Primary Examiner—L. T. Hix
Assistant Examiner—D. Rutledge
Attorney, Agent, or Firm—Oliff & Berridge

[57] ABSTRACT

In recording a color picture image on a photosensitive and pressure-sensitive recording medium, in accordance with one aspect of the invention, a light carrying an image of an original is exposed on the recording medium through a main optical path and a light carrying an image of a supplemental sheet is multiplexedly exposed on the same recording medium. The recording medium is thereafter pressure-developed to provide a visible composite color image. In another aspect of the invention, two mask members are provided, one for a half-tone image of the original and another for a fine line image thereof, wherein a light is exposed on the recording medium through the respective mask members to form a latent image in accordance with a light shielding image formed on the mask members, whereby reproducibility of the original image is improved.

14 Claims, 7 Drawing Sheets

METHOD AND APPARATUS FOR RECORDING IMAGE DATA IN MULTIPLEXED MANNER

BACKGROUND OF THE INVENTION

The present invention relates generally to a method and an apparatus for recording an image of an original on a recording medium, and more particularly to such a method and an apparatus in which image data are recorded in a multiplexed or composite manner.

Heretofore, known in the art is a recording apparatus which uses a photosensitive and pressure-sensitive recording medium. Such a recording medium is classified into two types; one is of a self-contained type and another is of a transfer type. In he self-contained type recording medium, an encapsulated chromogenic material or dye precursor and a developer material are co-deposited on one surface of a single substrate as one layer or as two contiguous layers. In the transfer type recording medium, the developer material is coated on a separate substrate as a separate developer sheet. The self-contained type recording medium is disclosed in U.S. Pat. No. 4,440,846 and the transfer type recording medium is disclosed in U.S. Pat. No. 4,399,209.

More specifically the photosensitive and pressure-sensitive recording medium has the substrate on which three kinds of pressure rupturable microcapsules are dispersely deposited. Cyan (C), magenta (M) and yellow (Y) chromogenic materials or dye precursors are separately encapsulated in the microcapsules together with a photo-curing or photo-softening material. The three kinds of the microcapsules are different in photo-sensitivity depending upon the wavelength of light. For example, the microcapsules containing cyan, magenta, and yellow chromogenic materials are photo-cured or photo-softened in response to the wavelengths of 650 nm, 550 nm, 450 nm, respectively. By exposing the lights of such wavelengths onto the recording medium in accordance with the image cf the original, a latent image corresponding to the original image is formed thereon. The recording medium is then subjected to pressure development to rupture the microcapsules which have not photo-cured or have remained softened and to react the chromogenic materials flown out from the ruptured microcapsules with the developer material, whereby a visible image is provided on the same recording medium or the separate developer sheet.

In a prior art recording apparatus using such recording medium, an image of a color original is scanned by a white light and the light reflected on the surface of the original is successively passed through color resolution filters of red, green and blue, and in response to an output from each of the filters three mask members are produced. Through the respective mask members, the recording medium is exposed in multiplexed manner. This type of recording apparatus is advantageous in that energy required for exposing the recording mediums is greatly reduced in comparison wi&h an apparatus of the type in which a white light is irradiated onto the color original and the reflected light is directly exposed on the recording medium.

In a copending U.S. patent application Ser. No. 050,313 filed May 14, 1987 by Sangyouji et al, it has been proposed an apparatus in which a mask member is produced utilizing an electrophotographying process. Such an apparatus will be briefly described with reference to FIG. 1.

In FIG. 1, with a laser exposure unit 1 and a xerography unit 2, a monochromatic (preferably black) toner image corresponding to each of the resolution colors of the original color image, i.e. red, green and black, is separately formed on a light transmissive member 3 (hereinafter referred to as "red mask member", "green mask member", and "blue mask member", respectively). Such a light transmissive member 3 is moved toWard the direction indicated by an arrow A. The red, green and blue mask members are successively set to a predetermined position above the recording sheet S and brought to be in facial contact with the recording sheet S. Each time the mask member is set, the recording sheet S is exposed by a light which has passed through the corresponding filter 4. The recording sheet S is thus exposed in multiplexed manner. As shown in FIG. 2, the recording sheet S is next fed into a nip between a pair of pressing rollers 6 with which the uncured microcapsules are ruptured and the chromogenic material which flows out from the microcapsules reacts with the developer material to thereby form a visible image.

Referring next to FIGS. 3A through 3E, the relation of the color hues betWeen the mask members and the recording sheet S will be described. The red mask member 3R is formed in accordance with a picture signal obtained by scanning a white light on the color picture original and then passing the reflected light through a red-color transmitting filter. As shown in FIG. 3A, a toner which is a light shielding material is adhered to areas designated by numerals 2, 4 and 5 by means of an electrophotography laser printer or the like. A light having a wavelength of 650 nm is irradiated through the red mask member onto the recording medium and the exposed microcapsules encapsulating the cyan chromogenic material (which microcapsules will hereinafter be referred to as "cyan microcapsules") on the recording medium are photo-cured. That is, the cyan microcapsules in areas of 1 and 3 on the recording sheet S are photo-cured and the remaining microcapsules remain uncured.

Next, as shown in FIG. 3B, a light having a wavelength of 550 nm is irradiated which selectively cures the microcapsules encapsulating the magenta chromogenic material (which microcapsules will hereinafter be referred to as "magenta microcapsules") That is, the magenta microcapsules in the areas of 1, 2 and 5 are cured. Likewise, upon irradiating on the recording sheet S a light having a wavelength of 450 nm which selectively photo-cures the microcapsules encapsulating yellow chromogenic material (which microcapsules will hereinafter be referred to as "yellow microcapsules"), the yellow microcapsules in the areas of 1 and 2 are photo-cured.

The recording sheet S which has thus been multiplexedly exposed is pressed by the pair of pressure rollers 6 to rupture the uncured microcapsules. Upon reaction of the chromogenic material which flows out from the ruptured microcapsules with the developer material, the color latent image is developed and a visible color image appears as shown in FIG. 3E. Specifically, in the area 2 of the recording sheet S, since only the cyan microcapsules remain uncured, the cyan-color appears when developed. Since the magenta and yellow microcapsules remain uncured in the area of 3, the red color appears when developed. Since all kinds of microcapsules remain uncured in the area of 4, black-color appears when developed. Similarly, green-color appears in the area 5 and white-color appears in the area 1.

It is to be noted that the wavelengths of the light which photo-cure the respective microcapsules need not be in coincidence with those of three primary colors of red, green and blue. The wavelengths of the photo-curing lights can be selected, provided that they are sensitive to the respective microcapsules and no cross talk is caused.

In the recording apparatus as described above, a photo-slide may be utilized in place of the mask member. By using the photo-slide, a post card or such kind of printed matters can be produced. Printed matters can also be produced based on photographs, in which case the light reflected from the photograph is used.

In the prior art recording apparatus, it has been impossible to produce the printed matters while modifying the images of the photo slide or pictures with modification.

Further, in the case where the image on the original is made up of a chromatic picture image and a monochromatic (for example, black) fine line image (for example, alpha/numerics or characters), the respective colors of the reproduced image are displaced from one another if the respective color mask members are not accurately placed in a predetermined position when exposed. Particularly, in the case where black fine lines are included in the original, the displacement of the colors tends to be notable, since the black color is reproduced by an additive mixture of cyan, magenta and yellow colors.

When high resolution mask members are prepared for reproducing small-size characters of, for example, several points, the resolution of the reproduced character is lowered if there is a displacement in positioning the color mask members. Consequently, the reproduced character image becomes low in quality.

As to the picture image which is required to be reproduced in half-tone images, a quasi-gradation technique, such as an area gradation method is generally employed when preparing the mask members. For example, $8 \times 8$ dot matrix undertakes reproduction of a 64-gradation half-tone image. In such a case, provided that the printer resolution is 10 dot/mm, the size of one dot is 100 micrometer. Accordingly, one side of the pixel defined by $8 \times 8$ dot matrix is 800 micrometer (0.8 mm). If the line images are reproduced with 2-gradation, it is impossible to reproduce lines interspaced with less than 0.8 mm, and thus the solution of such line image is extremely lowered. In order to provide a good reproducibility of the line images while maintaining a good reproducibility of the picture images, a quasi-gradation technique, such as an edge gradation method or an average error square method, is employed when the mask member is prepared. However, a complicated arithmetic processing needs to be carried out for expressing the original image in a quasi-gradation, so that a software program and a hardware, such as a CPU, becomes large in scale, and in addition, a memory of a large storage capacity needs to be mounted. Moreover, it takes a long period of time for carrying out the arithmetic operation, and hence the recording speed is lowered.

SUMMARY OF THE INVENTION

The present invention has been accomplished in view of the foregoing, and accordingly it is a primary object of the invention to provide a method and an apparatus for recording an image of an original, in which the image of the original can be recorded while modifying the same.

Another object of the invention to provide a method and an apparatus for recording an image of an original, with which a color displacement of the reproduced images is eliminated while improving gradation reproducibility of a picture image.

Still another object of the invention is to provide a method and an apparatus for recording an image of an original, in which reproduction of an original containing both the line images and picture images is improved.

Yet another object of the invention is to provide a method and an apparatus for recording an image of an original, in which the recording speed is increased and components or elements which are necessary for image processings are simplified.

In one aspect of the present invention, a main optical system and an auxiliary optical system are provided in which the main optical system serves to expose on the recording medium with a light carrying an image of an original and the auxiliary optical system serves to expose on the recording medium with a light carrying an image of a supplemental sheet. By the main and auxiliary optical systems, the same recording medium is multiplexedly exposed, and the modified recordation of the original image can thus be accomplished in view of the image of the supplemental sheet. In this case, by increasing the intensity of the light from the auxiliary optical system, the light from the main optical system can be invalidated so as not to form a latent image in accordance with the light from the main optical system.

In another aspect of the invention, two kinds of mask members are prepared; one for a color picture area which needs to be reproduced in half-tone (hereinafter referred to as "half-tone area") and another for a fine line area which needs not be reproduced in half-tone (hereinafter referred to as "fine line area"). Of the half-tone area mask member, the fine line area is completely masked and in exposing the half-tone area, lights of wavelengths corresponding to red, green and blue are successively exposed on the recording medium through the red-, green-, and blue-mask members which are produced in accordance with a quasi-gradation technique. Of the fine line area mask member, the half-tone area is completely masked and the images in the fine line area is printed in binary format on the mask member. The lights of wavelengths corresponding to red, green and blue are successively or simultaneously exposed on the recording medium through such fine line area mask member.

DESCRIPTION OF THE PREFERRED EMBODIMENTS

A first embodiment according to the present invention will now be described with reference to the accompanying drawings.

Figure 1:
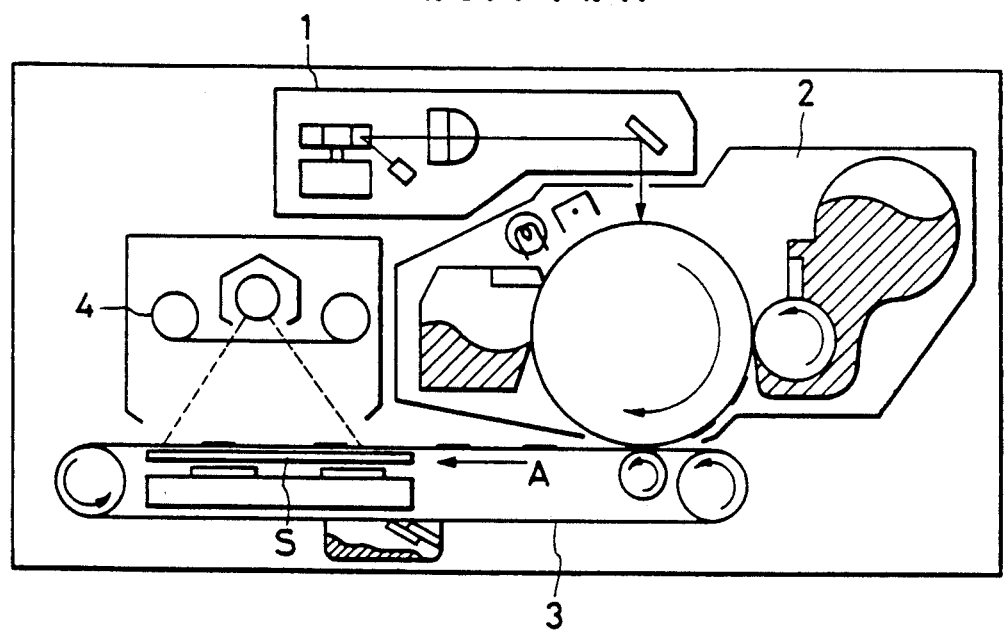
FIG. 1 is a cross-sectional side view showing a prior art recording apparatus.
Figure 2:
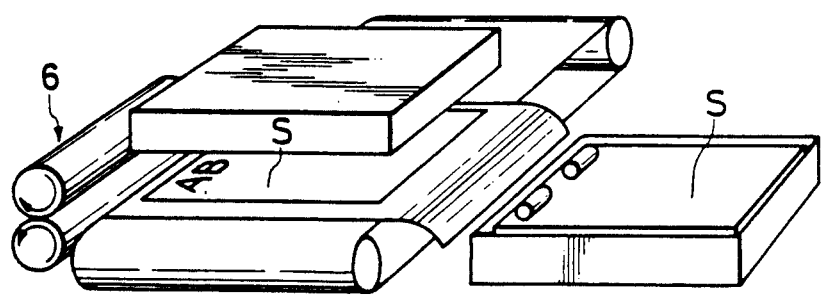
FIG. 2 is a perspective view showing a part of the recording apparatus shown in FIG. 1.
Figure 3A:
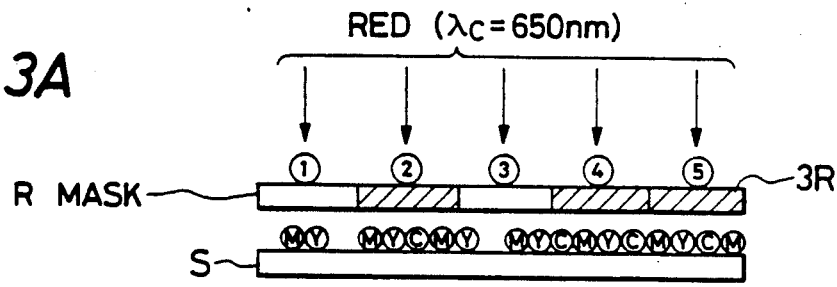
FIGS. 3A through 3E are explanatory diagrams for explanation of formation of a color image on a photosensitive recording sheet with the use of mask members.
Figure 3B:
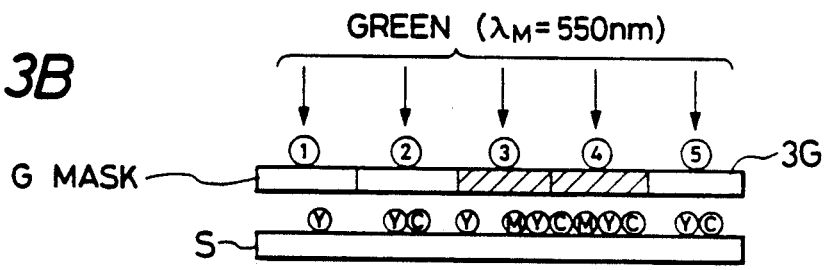
Figure 3C:
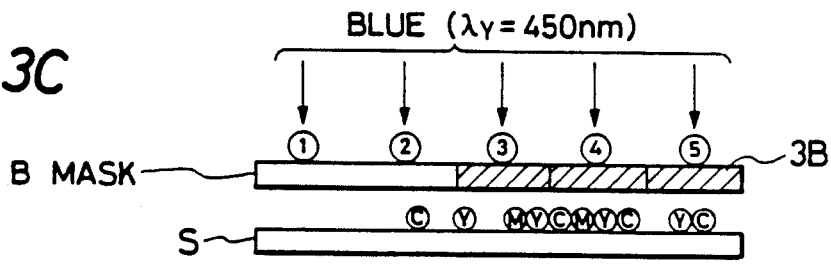
Figure 3D:
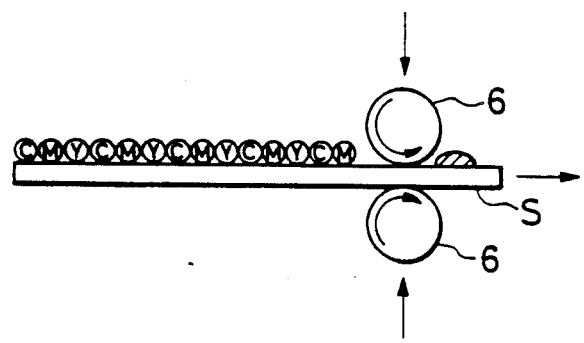
Figure 3E:
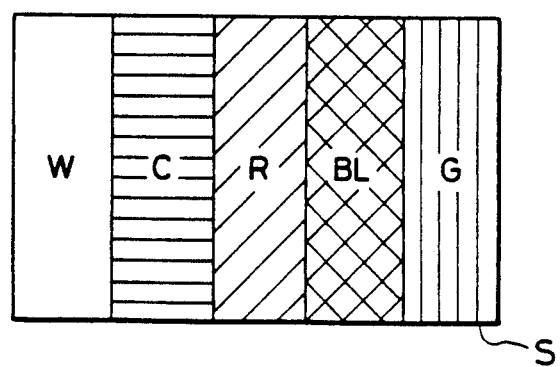
Figure 4:
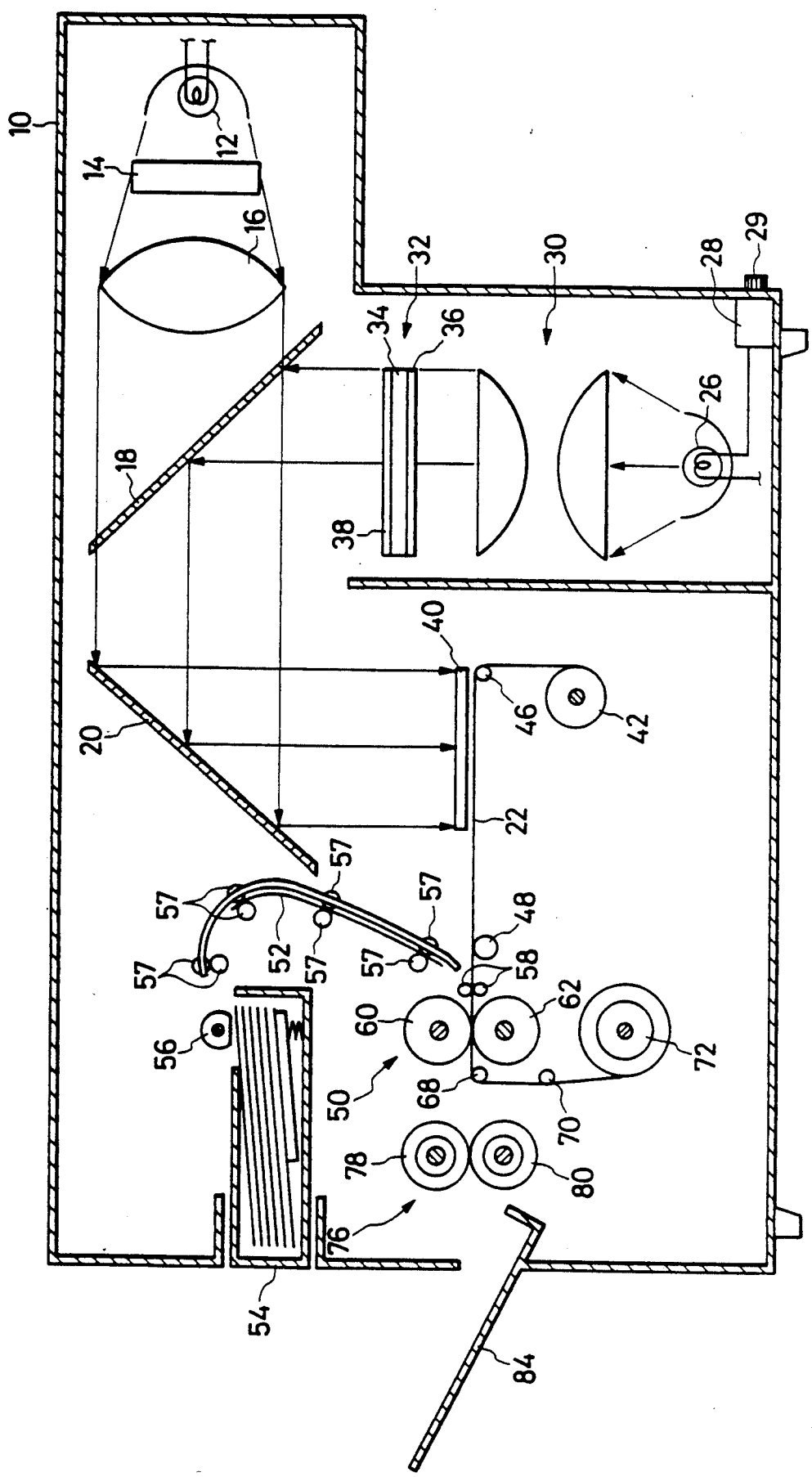
FIG. 4 is a cross-sectional side view showing a recording apparatus according to a first embodiment of the present invention.

FIG. 4 is a cross-sectional side view showing an image recording apparatus according to the first embodiment of the invention. In the figure, a housing 10 of the apparatus is in the form of a box shape, in the upper right portion of which a main light source 12 is installed so that the light radiated therefrom is directed to the left side wall of the housing 10. The light radiated from the main light source 12 passes through a slide 14, a lens 16 and a half mirror 18, and is directed downwardly upon reflection on a reflection mirror 20 to expose the photosensitive and pressure-sensitive recording medium 22. The slide 14 carries an original image and thus a latent image corresponding &hereto is formed on the recording medium 22. The main light source 12, lens 16 and reflection mirror 20 constitute a main optical system. The image on the slide 14 is a positive color image, which can be seen as real when viewed from the side of the main light source 12.

In the bottom portion of the housing 10, an auxiliarY light source 26 is installed so that the light is irradiated upwardly. A current supplying circuit (not shown) is provided which supplies a current to the auxiliary light source 26. An amount of current to be flown in the auxiliary light source 26 can be adjusted by turning a knob 29 and changing a resistance value, whereby the light intensity radiated from the auxiliary light source 26 can be adjusted. The light radiated from the auxiliary light source 26 passes through a collimator lens 30 with which the incident light is changed to a parallel light beam. The parallel light beam then passes through a crystal liquid panel 32 and is reflected on the half mirror 18. The half mirror 18 permits passage of the light radiated from the main light source 12 but reflects the light radiated from the auxiliary light source 26, whereby the light radiated from both the main light source 12 and the auxiliary light source 26 are composed. The light reflected on the half mirror 18 is further reflected on a reflection mirror 20, and the photosensitive and pressure-sensitive recording medium 22 is thereby exposed. In this case, when the light from the auxiliary light source 26 is strong, the light from the main light source 12 is made invalid and accordingly the recording medium 22 is exposed only by the light from the auxiliary light source 26. On the other hand, when the light from the auxiliary light source 26 is weak, the light from the main light source 12 is valid and thus the recording medium 22 is exposed by the lights from both the main and the auxiliarY light sources 12 and 26. Accordingly, latent images in accordance with the lights from both light sources are formed on the recording medium 22.

The liquid crystal panel 32 includes a liquid crystal section 34 made up of a number of liquid crystal cells, a deflection plate 36 and a light detection plate 38. The latter two plates are attached to front and rear surfaces of the liquid crystal section 34. The crystal liquid cell is made of P type nematic phase liquid crystal, and liquid crystal cells of a thickness of about ten and several microns is interposed between a pair of glass plates each covered with a transparent electrically conductive film so that the molecular axis of the liquid crystal is twisted by 90 degrees between the input and output sides of the liquid crystal section 34. The deflection plate 36 and the light detection plate 38 are arranged so that the deflection axes of those plates are made in parallel with each other.

The direction of the molecular axis of the liquid crystal is changed depending upon whether or not a voltage is applied to the liquid crystal cell. When no voltage is applied thereto, the deflection axis of the light entered the liquid crystal upon being deflected by the deflection plate 36 is rotated by 90 degrees and accordingly the light does not appear in the light detection plate 38, since the deflection axis of the light is shifted by 90 degrees with respect to that of the light detection plate 38. That is, when the voltage is not applied to the liquid crystal cell, the light cannot pass through the liquid crystal panel 32. When a voltage is applied thereto, the direction of the molecular axis is changed and the deflection axis of the incident light is not rotated, so that the light appears in the light detection plate 38. Accordingly, when the voltage is selectively applied to the crystal liquid cells, a desired part of the input parallel light beam is allowed to pass through the liquid crystal panel 32. In this case, depending upon which parts of the liquid crystal panel 32 the light is passed through, the portion of the recording medium 22 to be exposed by the auxiliary light source 26 is determined. For example, if the right half portion (in FIG. 4) of the liquid crystal panel 32 is allowed to pass &he light, the downstream portion of the recording medium 22 is exposed, whereas if the left half portion (in FIG. 4) of the liquid crystal panel 32 is allowed to pass the light, the upstream portion of &he recording medium 22 is exposed.

In the embodiment shown in FIG. 4, a supplemental sheet 40 is stretched in the exposure region so as to be in contact with the recording medium 22, and the lights from the main light source 12 and the auxiliary light source 26 are exposed through the supplemental sheet 40 on the recording medium 22. The supplemental sheet 40 is made of, for example, a transparent resin, and images, such as alpha/numerics, characters, marks, symbols or the like, are printed thereon. Since the latent image corresponding to the image of the slide 14 is formed on the recording medium 22 in such a manner that the leftside of the image of the slide 14 is reversed to rightside and vice versa, the face of the supplemental sheet 40 is reversed so that the imagewise of both latent images agrees with each other.

By exposing the recording medium 22 through the supplemental sheet 40 with the light emanated from the auxiliary light source 26, a latent image corresponding to the image of the supplemental sheet 40 can be multiplexed to the latent image corresponding to the slide 14. Provided that the intensity of the light intensity of the auxiliary light source 26 is increased and the liquid crystal panel 32 is controlled so that the light is irradiated on the recording medium 22 through a part of the supplemental sheet 40, not only the latent image corresponding to the image of the slide 14 but also the latent image corresponding to the image of the supplemental sheet 40 are formed on the recording medium 22. In this manner, by changing the light intensity of the auxiliary light source 26 and selecting the exposure region according to the auxiliary light source 26, a modified recordation of the image of the slide 14 can be accomplished. In this embodiment, an auxiliary optical system is constituted with the half-mirror 18, the auxiliary light source 26, the collimator lens 30 and the liquid crystal panel 32.

In the case when the recording apparatus according to this embodiment is used for producing private postcards, the width of the recording medium 22 i.e. the dimension in the direction perpendicular to the moving direction of the recording medium 22, is made slightly larger than that of the postcard. Such recording medium 22 is supplied from a supply roll 42, fed through guide rollers 46 and 48, and placed directly below the light coming from the reflection mirror 20.

In the downstream of the recording medium transporting direction, a developer unit 50 and a sheet cassette 54 are provided. In the sheet cassette 54, developer sheets 52 on which a developer material is coated are stacked. The developer sheet 52 is cut to the size as same as the postcard. The uppermost developer sheet 52 is taken out by a take out roller 56 and is transported by a plural pairs of guide rollers 57. By means of a pair of rollers 58, the developer sheet 52 is overlayed on the recording medium 22. The developer sheet 52 and the recording medium 22 are fed into the developing unit 50 where the latent image on the recording medium 22 is developed and transferred on the developer sheet 52.

The developing unit 50 includes a pair of pressing rollers 60 and 62 which are rotatable about their center axes extending in the widthwise direction of the recording medium 22. The counterpart roller 60 is rotated by a motor (not shown) and in accordance with rotations of the rollers of 60 and 62, the recording medium 22 and the developer sheet 52 which are held in facial contact with each other and are transported while being thereby pressed, whereby pressure development is carried out.

After passing through the nip between the rollers 60 and 62, the recording medium 22 is guided by guide rollers 68 and 70 and wound around a take-up reel 72. The take-up reel 72 is connected to the motor for rotating the roller 60 through a friction clutch (not shown), so that the length of the recording medium 22 transported by the rollers 60 and 62 is equal to the length wound around the take-up reel 72.

The developer sheet 52 is fed to a glossing unit 76 in which included are a heat roller 78 having in its interior a halogen lamp as a heat source and a feed roller 80 which together with the heat roller 78, feeds the developer sheet 52. Upon heating, the developer sheet 52 is processed to give a glossy surface and the image transferred thereto is thermally fixed. The resultant developer sheet 52 is thereafter exhausted onto a tray 84.

Next, a recording operation will be described for recording a picture and characters in the upper and lower halves of the developer sheet 52 respectively with the use of the recording apparatus arranged as described above.

Figure 5A:
FIGS. 5A through 5F are explanatory diagrams for explanation of forming a composite image on the recording medium.
Figure 5B:
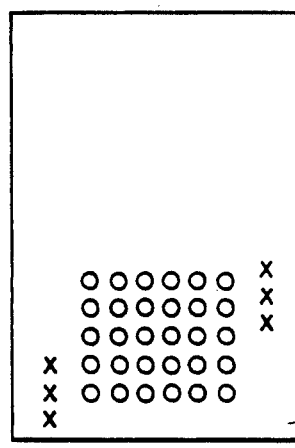
Figure 5C:
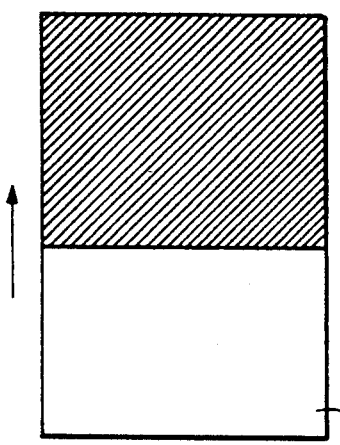
Figure 5D:
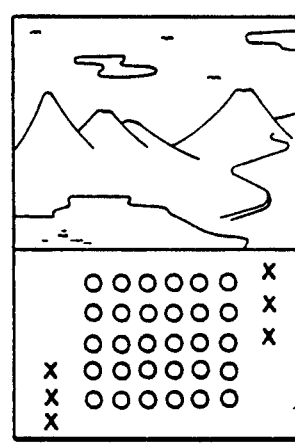

The slide 14 is such that is contains a scenery 88 as shown in FIG. 5A, and the supplemental sheet 40 is such that it contains some messages 90 in the lower half portion thereof as shown in FIG. 5B. The liquid crystal panel 32 is controlled so that only the upstream portion thereof (with reference to the transporting direction of the recording medium 22 as shown by an arrow in FIG. 5C) permits to pass light. The intensity of the light from the auxiliary light source 26 is adjusted so as to invalidate the light from the main light source 12, so that only a latent image based only upon the light from the auxiliary light source 26 is formed. When the lights are emanated simultaneously from the main light source 12 and auxiliary light source 26, the latent image of the scenery 88 in the upper half portion of the slide 14 is formed in the upstream portion of the recording medium 22 and the latent image of the messages 90 is formed in the downstream portion of the recording medium 22. With development and fixing of the recording sheet, a composite images as shown in FIG. 5D are obtained in which in the upper portion thereof the scenery is recorded and in the lower portion thereof the messages are recorded.

Figure 5E:
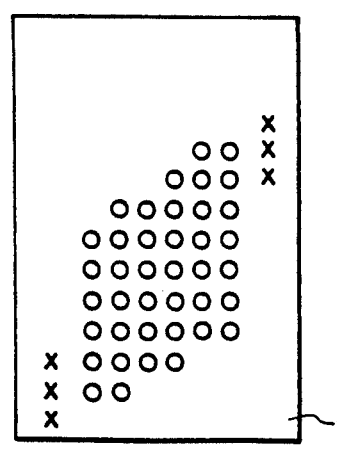
Figure 5F:
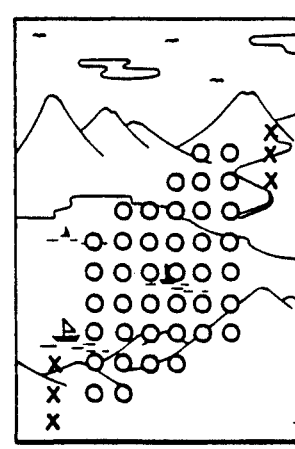

According to the image recording apparatus according to the first embodiment, it is further possible to overlappingly record both the scenery and the messages as a whole as shown in FIG. 5F. In such a case, the slide as shown in FIG. 5A is used and the supplemental sheet to be used contains the messages distributed over substantially the entire surface as shown in FIG. 5E. The liquid crystal panel 32 is controlled so that the entire lights from the auxiliary light source 26 are passed therethrough. Further, the light intensity of the auxiliary light source 26 is adjusted so as not to invalidate the light from the main light source 12. That is, the lights from both the main light source 12 and the auxiliary light source 26 are made to be effective in forming the respective latent images. By simultaneoulsy exposing the recording medium 22 with the light irradiated from the main light source 12 and the auxiliary light source 26, the latent images caused by both light sources are formed. By the subsequent developing and fixing processings, the recording image as shown in FIG. 5F is obtained in which the scenery and the messages are overlappingly recorded.

In the above described first embodiment, although it has been described that the scenery and the messages are recorded in a composite manner with the use of the supplemental sheet, it maY be possible not to use the supplemental sheet. In this case, if the intensity of the auxiliary light source is increased so as to invalidate the light from the main light source and the light from the auxiliary light source is partially exposed on the recording medium, a blank can be formed at a desired portion.

It is of course possible to used the recording apparatus not only for producing the postcards but also for producing materials of a desired dimension.

Although it has been described that the transfer-type recording medium is used as the recording medium, it is possible to use the self-contained type recording medium. Furthermore, the photosensitive resin contained in the microcapsule may be of the type in which the same is originally hardened and is softened upon exposure.

Referring &o FIGS. 6 and 7, a second embodiment of the present invention will be described.

Figure 7D:
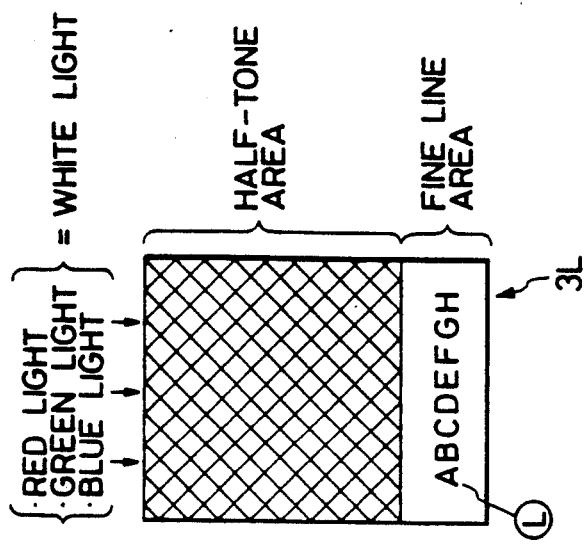
FIGS. 7A through 7E are explanatory diagrams for explanation of forming a color image on the recording medium.
Figure 7C:
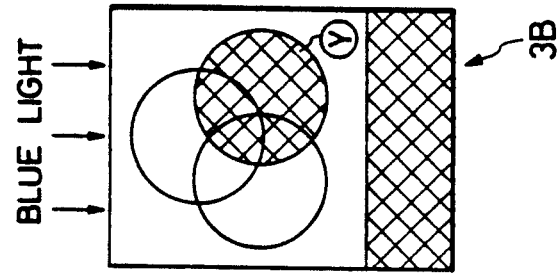
Figure 7B:
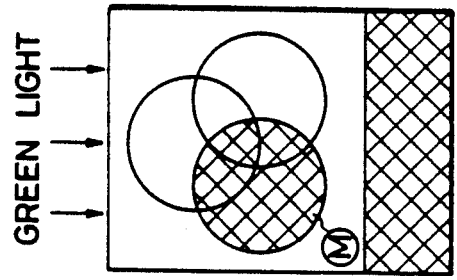
Figure 7A:
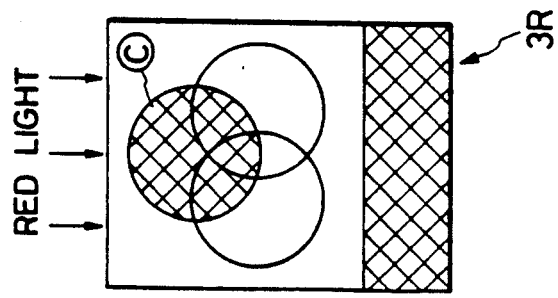
Figure 7E:
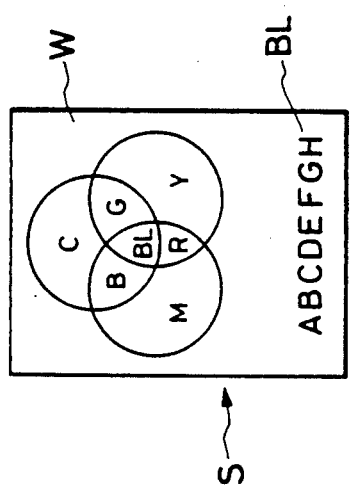

FIGS. 7A through 7E are explanatory diagrams for description of a method for producing a mask member and of the finally obtained color images. FIGS. 7A through 7C show red, green and blue half-tone mask members 3R, 3G and 3B, respectively, which are produced by using a quasi-gradation technique with respect to the half-tone areas. The fine line areas are completely masked. FIG. 7D shows a mask member 3L in which the half-tone area is completely masked and the fine line area is recorded according to a binary expression method. The cross hatching portions in the figures denote the mask areas masked with a light shielding material, such as a black-color toner. FIG. 7E shows an image made up of full-color half-tone areas and binary expressed monochromatic fine line areas. The image in FIG. 7E is obtained by exposing lights through the respective mask members and pressure-developing the same.

In order to produce the red-color mask member 3R, the cross-hatched circular portion to be reproduced in cyan color is mesh-masked at a rate of area depending upon the color density in accordance with the quasi-gradation technique, and the cross-hatched lower rectangular fine line area is masked completely, i.e. at 100% in the rate of area. Exposure of the photosensitive and pressure-sensitive recording medium S with a light having a wavelength which causes to photo-cure the microcapsules containing cyan chromogenic material through the red-color mask member 3R, the cyan microcapsules other than those being masked are photo-cured while the cyan microcapsules which are masked and thus not exposed are not photo-cured.

Similarly, in order to produce the green-color and the blue-color mask members 3G and 3B, the cross-hatched circular portions in FIGS. 7B and 7C to be reproduced in magenta-color and yellow-color, respectively, are mesh masked in accordance with the quasi-gradation technique. The fine line areas are completely masked. By repeatedly exposing the green and blue lights through the respective mask members onto the recording medium S, latent images of cyan- magenta- and yellow-colors are formed on the recording medium. At this stage, since the fine line areas have not yet been exposed, the microcapsules in such areas have not photo-cured.

Next, when the red-, green- and blue-lights are simultaneously or successively exposed through the mask member 3L for the fine line areas, the microcapsules underlying the half-tone areas are no longer photo-cured due to the mask and the background Of the fine line areas other than the masked portion are exposed to thereby photo-cure the microcapsules.

After exposing the recording medium S in such a manner, the recording sheet S is subjected to pressure development to rupture the uncured microcapsules and react the respective chromogenic materials with the developer materials. As a result, the half-tone color image areas and the binary expressed fine line areas are obtained in a single sheet as shown in FIG. 7E. In FIG. 7E, characters C, M, Y, R, G, B, W, and BL denote respectively colors of cyan, magenta, yellow, red, green, blue, white and black. It is to be noted that the half-tone areas represented in FIGS. 7A through 7C need not be mesh-masked at the same area rate but can be mesh-masked at a desired rate of area depending upon the color density of each of the colors. Further, the hue in the fine line areas may be other than black and white. To this effect, if two colors of, for example, red- and green-color lights are exposed through the mask for the fine line areas, the background is colored in Yellow and the fine line portions are colored in black. When the red-, green- and blue-color lights are successively exposed and if the mask is removed when exposing the blue color, the background of the fine line portion becomes white and the fine line region become blue.

Figure 6:
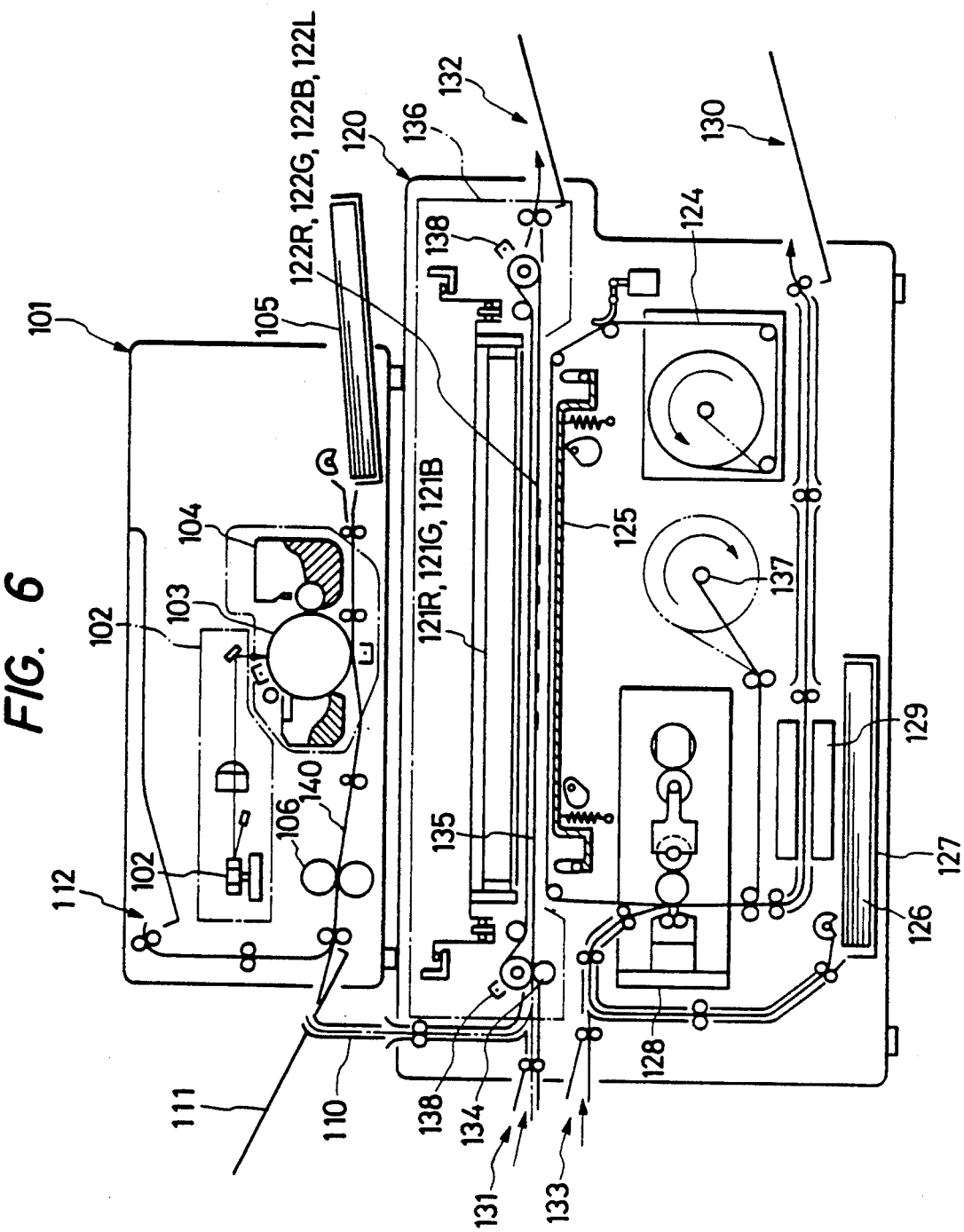
FIG. 6 is a cross sectional side view showing a recording apparatus according to a second embodiment of the present invention.

FIG. 6 is a cross-sectional side view showing an image recording apparatus carrying out the recording method according to the second embodiment of the invention The recording apparatus in FIG. 6 includes a monochromatic laser printer 101 in which a multi-surfaced polygon scanner 102 is rotatably provided for directing a laser light onto a photosensitive drum 103. The drum 103 has been previously charged to a predetermined polarity and an electrostatic latent image is formed thereon where the laser light is exposed. The latent image on the drum 103 is developed by toner powder in a developer unit 104, and the thus developed toner image is transferred onto an ordinary paper or a sheet for use in an overhead projector which is fed from a sheet cassette 105. The toner image transferred on the paper or sheet is fixed in a fixing unit 106. Normally, the monochromatic laser printer 101 stores data transmitted from a host computer (not shown). A color image recording apparatus 120 records picture images using mask members produced in accordance with the color picture data. In the apparatus shown in FIG. 6, when a monochromatic image output is needed, such a copy is produced by the monochromatic laser printer 101 and is exhaused onto a tray 111 or 112.

The color recording apparatus 120 includes a paper guide unit 110 which guides half-tone mask members 122R, 122G and 122B and a fine line mask member 122L to an exposure unit 136. These mask members are brought in facial contact with a photosensitive and pressure-sensitive recording medium 124 on an exposure stand 125. Light sources 121R, 121G and 121B for exposing three primary colors of red, green and blue are provided above the exposure stand 125 for exposing the respective color lights onto the recording medium 124 through the mask members. A sheet accommodating unit 127 is provided in the bottom portion of the apparatus for accommodating developer sheets 126 which are in cut form and one surface of which is coated with a developer material. The developer material on the developer sheet 126 reacts with a chromogenic material contained in a microcapsule coated on the surface of the recording medium 124. The developer sheet 126 and the recording medium 124 are fed into a pressure developing unit 128 while being held in facial contact with each other, in which the microcapsules which remain uncured are ruptured and an image is developed on the developer sheet 126. A heat fixing unit 129 is provided for accelerating the fixing of the developed image. An exhaust tray 130 is provided for receiving the color copy sheet. The mask members are inserted from an insertion tray 131 and the mask members which have exposed are exhausted onto an exhaust tray 132. Another insertion tray 133 is provided for inserting the developer sheets into the apparatus.

Next, a color mode reproducing operation will be described. A mask member 122R is produced by the monochromatic laser printer 101 in accordance with the quasi-gradation technique and passes through a guide unit 110. By means of a roller 134 for regulating the position of the mask member, the head edge of the mask member is placed in a predetermined position. An endless conveyor belt 135 is electrostatically charged by means of an electrostatic unit 138, such as a corotoron and the mask member 122R is electrostatically attached thereto. The conveyor belt 135 is made of an insulating material, such as PET. The mask member is conveyed by the conveyor belt 135 to an exposure unit 136. The mask member 122R is positioned so that &he colors of the latent images formed on the recording medium 124 are not displaced from one another. In the exposure unit 136, the mask member 122R and the recording medium 124 are held in facial contact with each other and are exposed by the light from the light source 121R, whereby a latent image corresponding to the mask member 122R is formed on the recording medium 124. After the exposure is taken place, the mask member 122R is sent to the tray 132. The same operation is carried out with respect to the mask members 122G and 122B. As a result, a latent image of the half-tone color image is formed on the recording medium 124.

Thereafter, the mask member 122L for the fine line image is transported to the exposure unit 136 in the similar fashion as is done for the mask member 122R. Upon positioning accurately on the recording medium 124, &he mask member 122L is made to be in intimate contact with the recording medium 124. After exposing with lights from the light sources 121R, 121G and 121B in multiplexed manner, the recording sheet 124 is sent to the tray 132. The recording medium 124 thus exposed is brought to be in facial contact with the developer sheet 126 and a pressure development is carried out in the pressure developing unit 128, whereby a visible color image is produced on the developer sheet. The developer sheet is thereafter sent to the heat fixing unit 129 and then exhausted onto the tray 130. The pressure developed recording medium 124 is wound around a take-up roller 137.

While description has been made with reference to the case where monochromatic laser printer is used, another type of printer, such as an LED printer or liquid crystal printer or heat transfer printer are available, provided that the chromatic mask members of red-, green-, and blue-color can be produced. Furthermore, the present invention is not limited to such apparatus using the photosensitive and pressure-sensitive recording medium but is applicable to a thermal developing method using a silver salt or silver halide photographic material while using the exposing method as described.

As is apparent from the foregoing description, the second embodiment deals with an image containing fine line areas and half tone areas, in which the fine line areas do not need to be reproduced with gradation and the half-tone areas need to be reproduced in half-tone. In accordance with the second embodiment, separate mask members are produced for the fine line areas and the half-tone areas, and the photosensitive recording medium is exposed through the respective mask members by the lights of red, green, and blue. Accordingly, the half-tone areas are reproduced in accordance with the quasi- gradation method, while the fine line areas are reproduced so that the high resolution monochromatic color line images are obtained with no color displacement.

What is claimed is:

1. An image recording apparatus for recording on a developer sheet an image corresponding to an image of an original sheet with the aid of a photosensitive and pressure-sensitive recording medium separate from the developer sheet, said recording medium having a first material changeable from a first phase to a second phase when exposed to light, said first material comprising a photosensitive material and a chromogenic material selected from the colors comprising cyan, magenta and yellow, said photosensitive material and said chromogenic material being encapsulated in a pressure rupturable microcapsule and a mechanical strength of said microcapsule being different between the first phase and the second phase; said developer sheet having a second material comprising a developer material, said apparatus comprising: means for forming a first latent image on said recording medium; means for forming a second latent image on said recording medium, wherein said first and second latent images are multiplexed on said recording medium; and pressure-developing means for pressure-developing said multiplexed latent image by reacting said first material with said second material.

2. The image recording apparatus as claimed in claim 1, wherein said first latent image corresponds to an image of a first original and said second latent image corresponds to an image of a second original.

3. An image recording apparatus for recording on a developer sheet an image corresponding to an image of original sheet with the aid of a photosensitive and pressure-sensitive recording medium separate from the developer sheet, said recording medium having a first material changeable from a first phase to a second phase when exposed to light, said first material comprising a photosensitive material and a chromogenic material selected from the colors comprising cyan, magenta and yellow, said photosensitive material and said chromogenic material being encapsulated in a pressure rupturable microcapsule and a mechanical strength of said microcapsule being different between the first phase and the second phase; said developer sheet having a second material comprising a developer material, said apparatus comprising:

means for forming on said recording medium a first latent image corresponding to an image of a first original; means for forming on said recording medium a second latent image corresponding to an image of a second original, wherein said first and second latent images are multiplexed on said recording medium; and a pressure-developing means for pressure-developing said multiplexed latent image by reacting said first material with said second material, wherein said first latent image forming means comprises a first light source for radiating a light onto said first original and a first optical means for directing an output light from said first original to said recording medium, and wherein said second latent image forming means comprises a second light source for radiating a light and a second optical means for directing the light from said second light source to said second original and exposing an output light from said second original to said recording medium.

4. The image recording apparatus as claimed in claim 3, wherein said second optical means of said second latent image forming means further comprises means for partially interrupting the light radiated from said second light source and preventing an interrupted portion of the light from reaching said second original.

5. The image recording apparatus as claimed in claim 4, wherein said partially interruptable means comprises a liquid crystal cell, said liquid crystal cell interrupting the light from said second light source from being outputted in response to a voltage applied thereto.

6. The image recording apparatus as claimed in claim 5, wherein a light intensity of a light radiated from said second light source is adjustable so that the light radiated from said first light source is rendered invalid and only the second latent image is formed on said recording medium.

7. The image recording apparatus as claimed in claim 3, wherein an original to be reproduced includes a halftone reproducing color region and a fine line reproducing region, and said first latent image forming means includes a first mask member carrying a first light shielding image corresponding to an image in said half-tone reproducing color region and selectively changing the cyan chromogenic material containing microcapsule from the first phase to the second phase; a second mask member carrying a second light shielding image corresponding to the image in said half-tone color reproducing region and for selectively changing the magenta chromogenic material containing microcapsule from the first phase to the second phase; and a third mask member carrying a third light shielding image corresponding to the image in said half-tone color reproducing region and selectively changing the yellow chromogenic material containing microcapsule from the first phase to the second phase, said first latent image being multiplexedly formed on said recording medium by exposing a light through said first, second and third mask members, and said first, second and third light shielding images being expressed in multi-gradation in accordance with a color density of the image in said half-tone reproducing region.

8. The image recording apparatus as claimed in claim 7 wherein said second latent image forming means includes a fourth mask member carrying a fourth light shielding image corresponding to an image in said fine line reproducing region, said second latent image being formed by exposing a light through said fourth mask member, and said fourth light shielding image being expressed in binary form in accordance with the image in said fine line reproducing region, and wherein a region corresponding to said fine line reproducing area in each of said first, second and third mask members is completely masked with a light shielding material and a region corresponding to said half-tone color reproducing region in said fourth mask member is completely masked with the light shielding material.

9. A method for recording an image on a photosensitive and pressure-sensitive recording medium, said recording medium having a first material and a second material wherein said first material is changed from a first phase to a second phase when a light is exposed, said method comprising the steps of: forming a first latent image on said recording medium; forming a second latent image on said recording medium, wherein said first and second latent images are multiplexed on said recording medium; and pressure-developing said multiplexed latent image by reacting said first material with said second material.

10. The method as claimed in claim 9, wherein said first material comprises a photosensitive material and a chromogenic material selected from the colors comprising cyan, magenta and yellow, and said second material comprises a developer material, wherein said photosensitive material and said chromogenic material are encapsulated in a pressure rupturable microcapsule and a mechanical strength of said microcapsule is different between the first phase and the second phase of said first material.

11. The method as claimed in claim 10, wherein said first latent image corresponds to an image of a first original and said second latent image corresponds to an image of a second original.

12. The method as claimed in claim 11, wherein said forming step for forming said first latent image comprises radiating a light onto said first original and directing an output light from said first original to said recording medium, and wherein said forming step for forming said second latent image comprises radiating a light, directing said light to said second original and exposing an output light from said second original to said recording medium.

13. The method as claimed in claim 12, wherein said forming step for forming said second latent image further comprises partially interrupting said light from being reached to said second original.

14. The method as claimed in claim 10, wherein said step for forming said first latent image comprises: providing a first mask member carrying a first light shielding image corresponding to an image of a half-tone reproducing color region in an original, said first light shielding image being expressed in multi-gradation in accordance with a color density of the image in said half-tone reproducing region, and said first mask member selectively changing the cyan chromogenic material containing microcapsule from the first phase to the second phase; providing a second mask member carrying a second light shielding image corresponding to the image in the half-tone reproducing color region in the original, said second light shielding image being expressed in multi gradation in accordance with the color density of the image in said half-tone reproducing region, and maid second mask member selectively changing the magenta chromogenic material containing microcapsule from the first phase to the second phase; providing a third mask member carrying a third light shielding image corresponding to the image in the half-tone reproducing color region in the original, said third light shielding image being expressed in multi-gradation in accordance with the color density of the image in said half-tone reproducing region, and said third mask member selectively changing the yellow chromogenic material containing microcapsule from the fIrst phase to the second phase; providing a fourth mask member carrying a fourth light shielding image corresponding to an image in a fine line reproducing region of the original, said fourth light shielding image being expressed in binary form in accordance with the image in said fine line reproducing region; and exposing a light through said first, second, third and fourth mask members onto said recording medium, wherein a region corresponding to said fine line reproducing area in each of said first, second and third mask members is completely masked with a light shielding material and a region corresponding to said half-tone color reproducing region in said fourth mask member is completely masked with the light shielding material.

* * * * *